(12) United States Patent
Chen et al.

(10) Patent No.: US 9,842,782 B2
(45) Date of Patent: Dec. 12, 2017

(54) INTERMEDIATE STRUCTURE FOR TRANSFER, METHOD FOR PREPARING MICRO-DEVICE FOR TRANSFER, AND METHOD FOR PROCESSING ARRAY OF SEMICONDUCTOR DEVICE

(71) Applicant: MIKRO MESA TECHNOLOGY CO., LTD., Apia (WS)

(72) Inventors: Li-Yi Chen, Tainan (TW); Pei-Yu Chang, Tainan (TW); Chih-Hui Chan, Tainan (TW); Chun-Yi Chang, Tainan (TW); Shih-Chyn Lin, Tainan (TW); Hsin-Wei Lee, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/080,607

(22) Filed: Mar. 25, 2016

(65) Prior Publication Data
US 2017/0278760 A1    Sep. 28, 2017

(51) Int. Cl.
*H01L 21/66*    (2006.01)
*H01L 21/683*    (2006.01)
*H01L 25/075*    (2006.01)

(52) U.S. Cl.
CPC .......... *H01L 22/22* (2013.01); *H01L 21/6831* (2013.01); *H01L 22/14* (2013.01); *H01L 25/0753* (2013.01)

(58) Field of Classification Search
None
See application file for complete search history.

(56) References Cited

U.S. PATENT DOCUMENTS

| 6,024,631 | A | * | 2/2000 | Piper | B24B 37/30 |
| | | | | | 125/12 |
| 2003/0237061 | A1 | * | 12/2003 | Miller | G01R 31/2886 |
| | | | | | 438/18 |
| 2005/0064683 | A1 | | 3/2005 | Farnworth | |
| 2009/0130821 | A1 | * | 5/2009 | Cox | H01L 23/544 |
| | | | | | 438/455 |
| 2013/0076384 | A1 | * | 3/2013 | Chang | G01R 31/318513 |
| | | | | | 324/754.01 |

FOREIGN PATENT DOCUMENTS

| GB | 1420863 A | 1/1976 |
| JP | S60178639 A | 9/1985 |

* cited by examiner

*Primary Examiner* — Cheung Lee
(74) *Attorney, Agent, or Firm* — CKC & Partners Co., Ltd.

(57) ABSTRACT

A method for preparing a plurality of micro-devices for transfer includes temporarily bonding the micro-devices onto a carrier substrate; testing the micro-devices on the carrier substrate to determine if there is at least one first failed micro-device in the micro-devices; and removing the first failed micro-device from the carrier substrate.

9 Claims, 13 Drawing Sheets

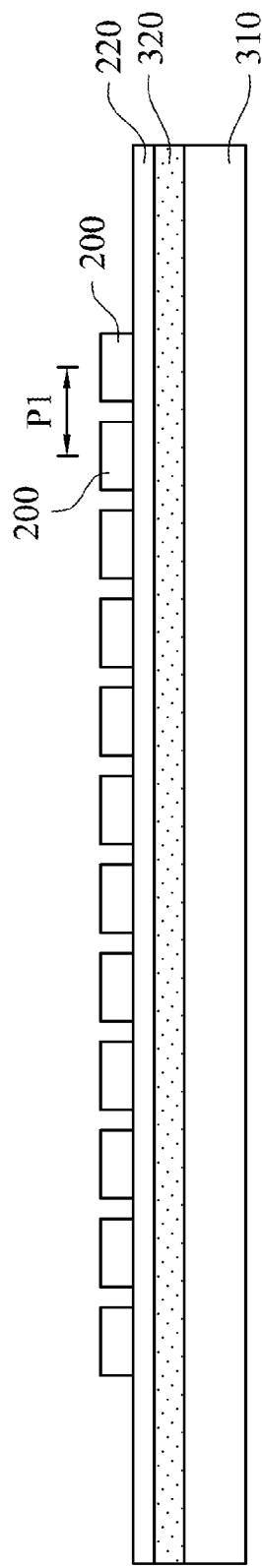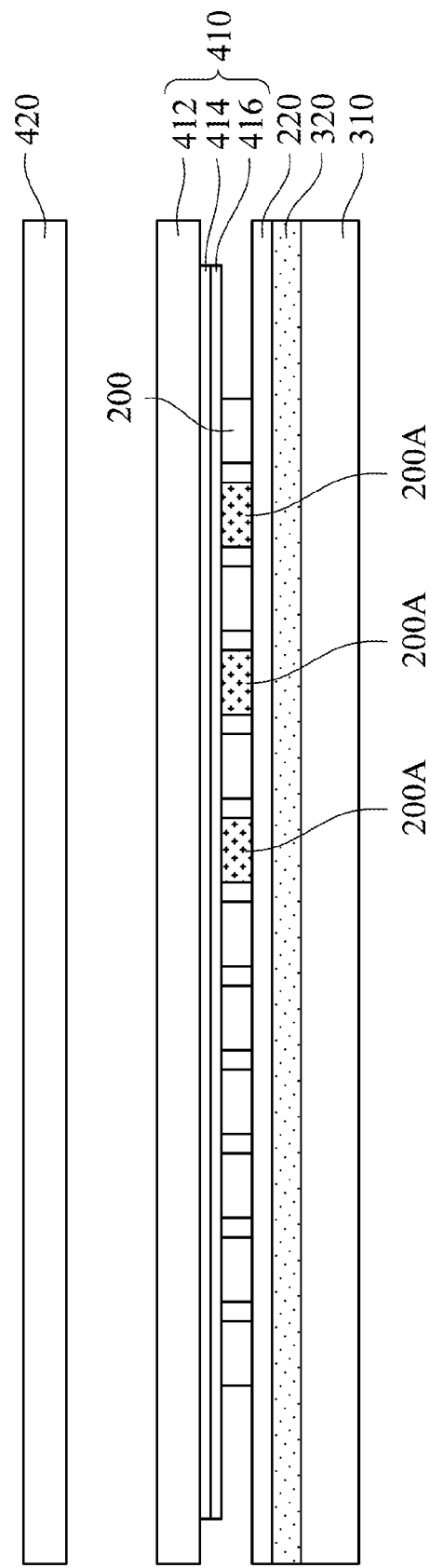
Fig. 2A
Fig. 2B

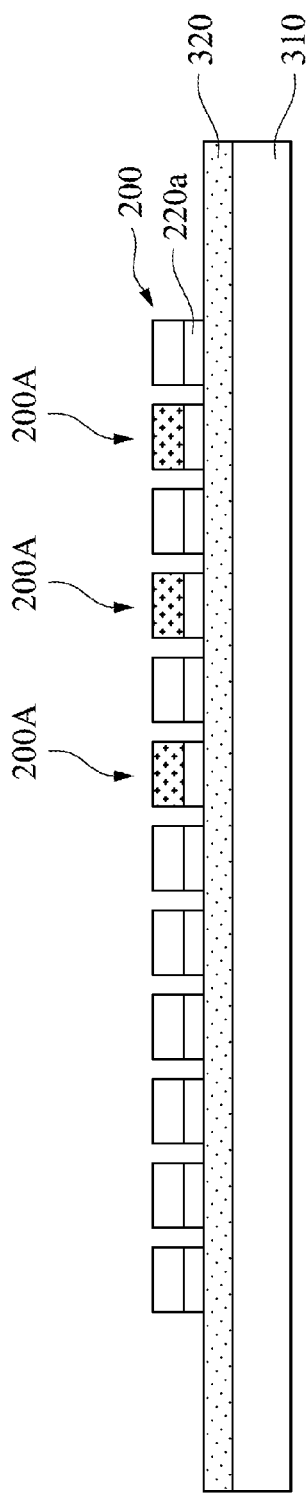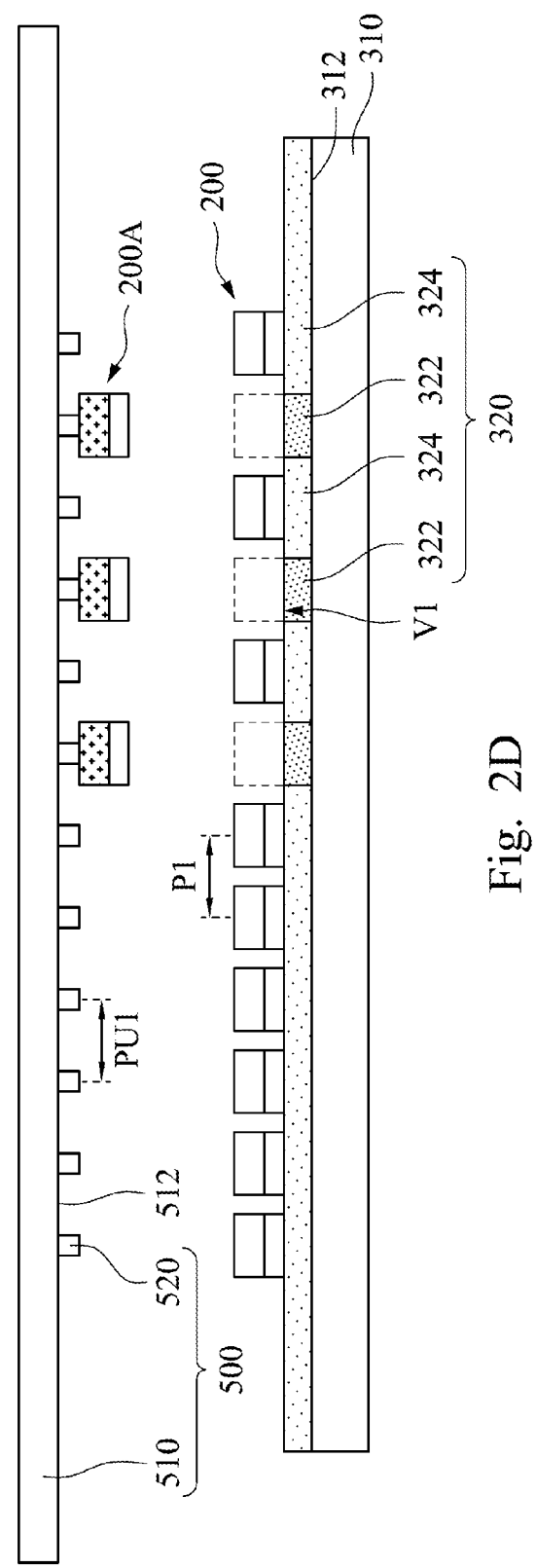

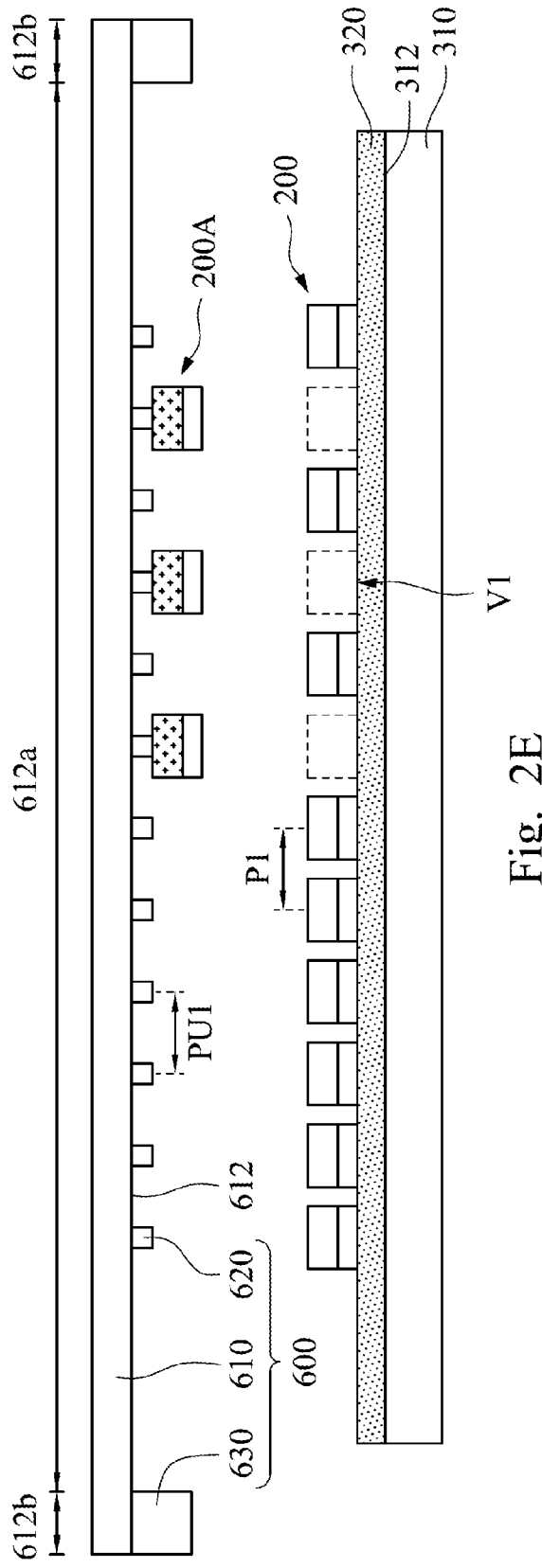
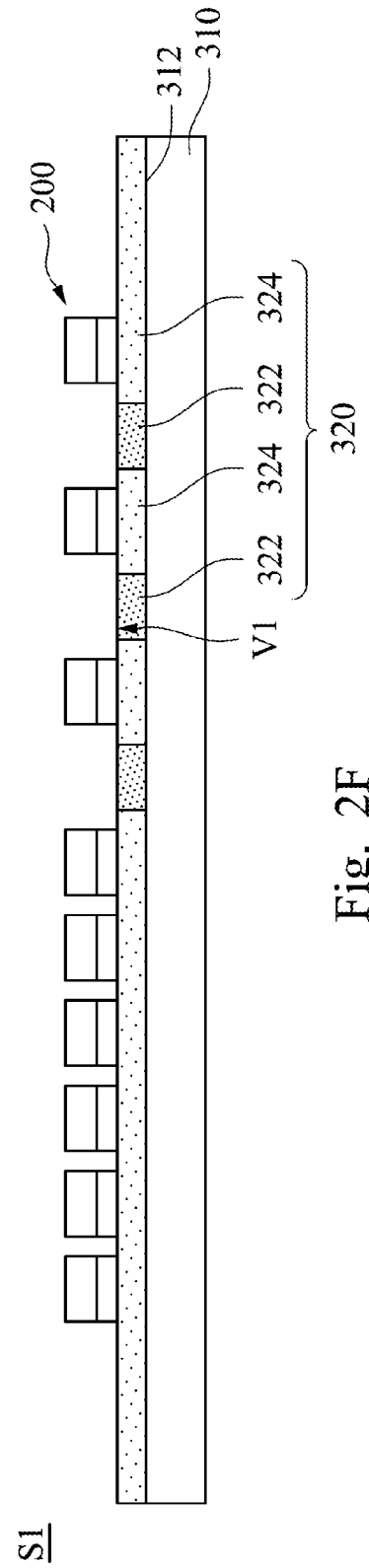
Fig. 2E
Fig. 2F

INTERMEDIATE STRUCTURE FOR TRANSFER, METHOD FOR PREPARING MICRO-DEVICE FOR TRANSFER, AND METHOD FOR PROCESSING ARRAY OF SEMICONDUCTOR DEVICE

BACKGROUND

Technical Field

The present disclosure relates to active solid-state devices.

Description of Related Art

In the recent years, light-emitting diodes (LEDs) have become popular in general and commercial lighting applications. As being light sources, LEDs have many advantages including low energy consumption, long lifetime, small size, and fast switching, and hence conventional illuminant technology, such as incandescent lamps, is gradually replaced by LEDs.

When light-emitting diodes are initially formed, a portion of the light-emitting diodes may be defective. When the light-emitting diodes are respectively transferred to pixels of a receiving substrate, the defective light-emitting diodes occupy spaces of the corresponding pixels but provide little performance for the illumination.

SUMMARY

According to some embodiments of this disclosure, a method for preparing a plurality of micro-devices for transfer is provided. The method includes temporarily bonding the micro-devices onto a carrier substrate; testing the micro-devices on the carrier substrate to determine if there is at least one first failed micro-device in the micro-devices; and removing the first failed micro-device from the carrier substrate.

According to some embodiments of this disclosure, an intermediate structure for transfer includes a carrier substrate, a plurality of tested semiconductor devices, and at least one temporary bonding layer. The tested semiconductor devices are present on the carrier substrate, in which the tested semiconductor devices pass at least one test, and there is no failed semiconductor device which does not pass the test on the carrier substrate. The temporary bonding layer is present between the tested semiconductor devices and the carrier substrate.

According to some embodiments of this disclosure, a method for processing an array of semiconductor devices is provided. The method includes disposing the array of semiconductor devices onto a receiving substrate, in which the array of semiconductor devices has at least one malfunctioning portion therein; and mending the malfunctioning portion in the array of semiconductor devices, wherein the mending comprises at least one of patching at least one void in the array of semiconductor devices with at least one patching semiconductor device when the malfunctioning portion comprises the void and repairing at least one failed semiconductor device in the array of semiconductor devices with at least one repairing semiconductor device when the malfunctioning portion comprises the failed semiconductor device.

It is to be understood that both the foregoing general description and the following detailed description are by examples, and are intended to provide further explanation of the disclosure as claimed.

DETAILED DESCRIPTION

Figure 1:
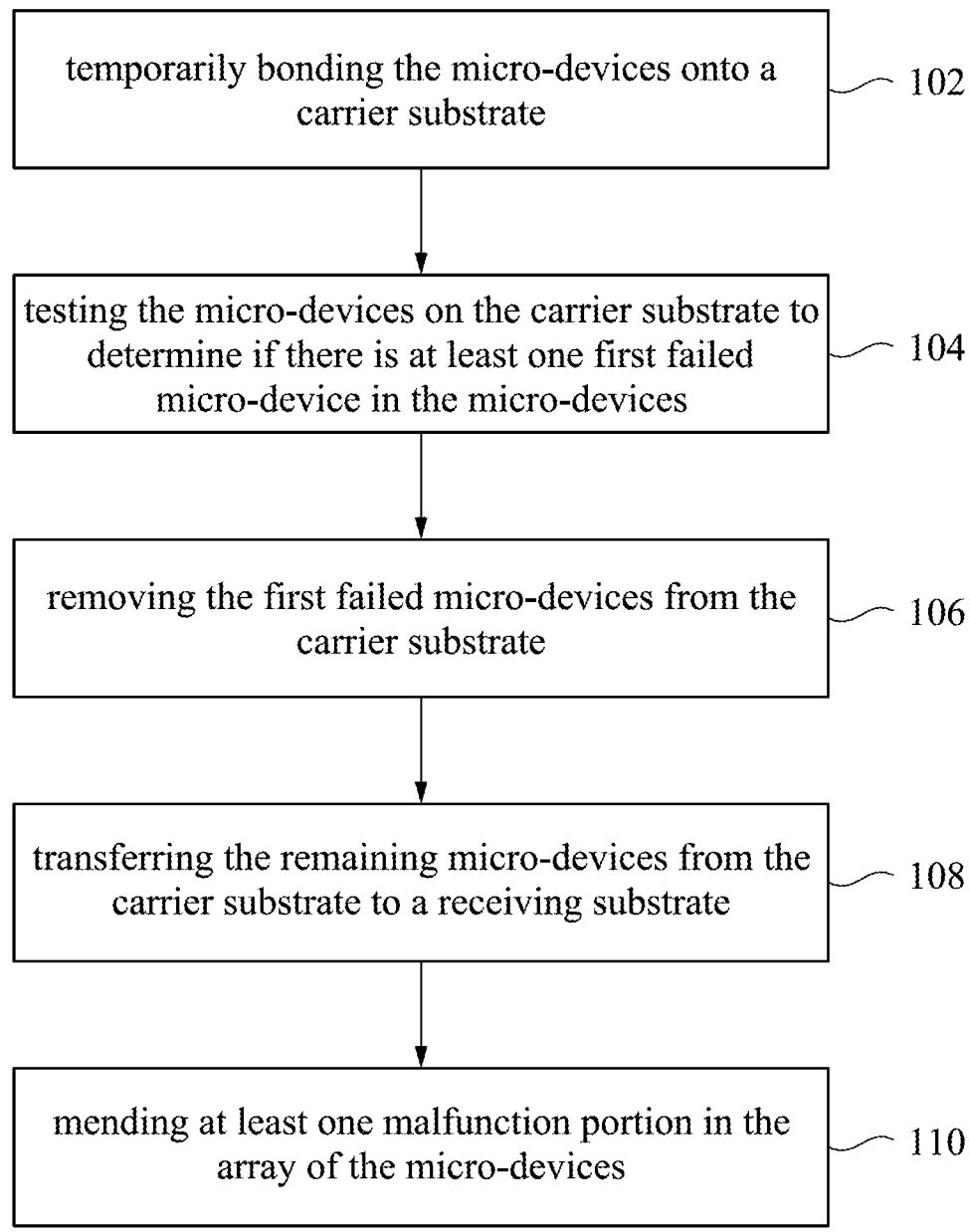
FIG. 1 is a flow chart of a method for transferring a plurality of micro-devices to a receiving substrate according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The terms "micro" device or "micro" LED (light-emitting diode) as used herein may refer to the descriptive size of certain devices in accordance with embodiments of the present disclosure. As used herein, the terms "micro" device or "micro" LED are meant to refer to the scale of 1 micrometer to 5 millimeters. However, it is to be appreciated that embodiments of the present disclosure are not necessarily so limited, and that certain aspects of the embodiments may be applicable to larger, and possibly smaller size scales.

It will be understood that when an element is referred to as being "on" another element, it can be directly on the other element or intervening elements may be present there between. In contrast, when an element is referred to as being "directly on" another element, there are no intervening elements present.

Figure 2G:
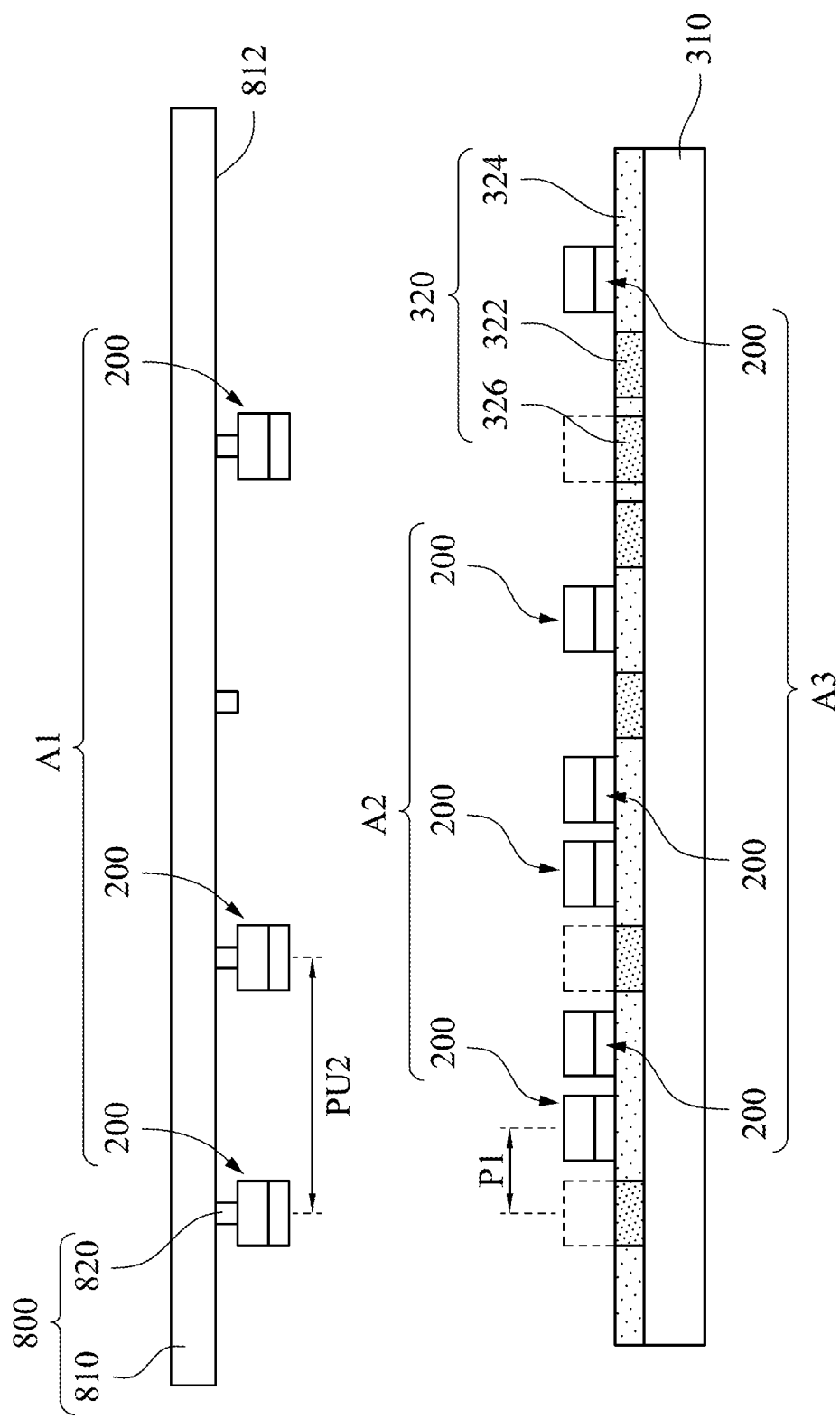
FIGS. 2A-2N are cross-sectional views of the method for transferring the micro-devices to the receiving substrate according to some embodiments of the present disclosure.
Figure 2H:
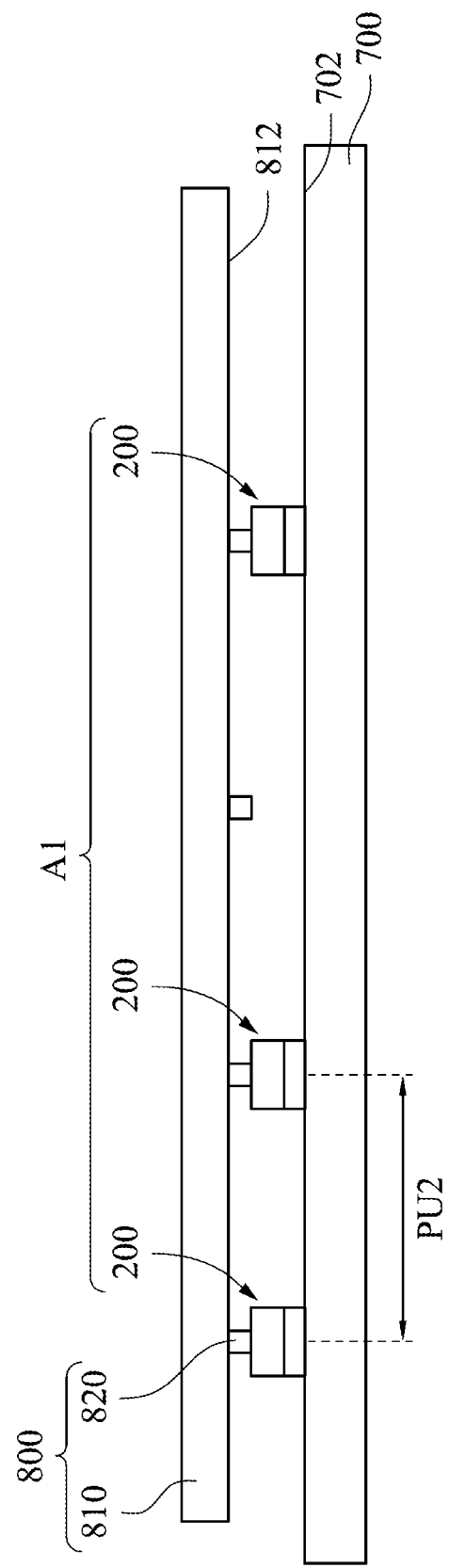

FIG. 1 is a flow chart of a method 100 for transferring a plurality of micro-devices to a receiving substrate according to some embodiments of the present disclosure. FIGS. 2A-2N are cross-sectional views of the method for transferring the micro-devices 200 to the receiving substrate 700 according to some embodiments of the present disclosure. It is understood that additional steps may be implemented before, during, or after the method 100, and some of the steps described may be replaced or eliminated for other embodiments of the method 100.

Referring to FIG. 1 and FIG. 2A, the method 100 begins at step 102 by temporarily bonding the micro-devices 200 onto a carrier substrate 310. The micro-devices 200 may be formed by epitaxially growing and etching a plurality of semiconductor layers. That is, the micro-devices 200 may include semiconductor devices, such as micro LEDs.

In some embodiments, a temporary bonding layer 320 may be initially disposed over the carrier substrate 310. A stack of semiconductor layers and a conductive layer 220 are attached to the temporary bonding layer 320, with the conductive layer 220 touching the temporary bonding layer 320. The semiconductors layers are patterned while the conductive layer 220 is not. The patterned semiconductors layers form the micro-devices 200 attached to the conductive layer 220. In some embodiments, the micro-devices 200 are arrayed on the carrier substrate 310, and adjacent micro-devices 200 on the carrier substrate 310 have a device pitch P1 therebetween.

In some embodiments of the present disclosure, the temporary bonding layer 320 bonds a combination of the micro-devices 200 and the conductive layer 220 to the carrier substrate 310. The temporary bonding layer 320 may be release adhesives, such as thermal release adhesives or UV (ultraviolet)-release adhesives. That is, the temporary bonding layer 320 is capable of being released by a variety of mechanisms, such as heating, UV exposure, or any combination thereof. The released temporary bonding layer provides little adhesion force against the conductive layer 220 and the carrier substrate 310.

Referring to FIG. 1 and FIG. 2B, the method 100 proceeds to step 104 by testing the micro-devices 200 on the carrier substrate 310 to determine if there is at least one first failed micro-device 200A in the micro-devices 200. At least one of variety of methods for testing the micro-devices 200 is performed by utilizing a testing tool 410 to drive the micro-devices 200 and utilizing a photo sensor 420 to determine whether the micro-devices 200 are lighted.

Herein, the testing tool 410 may include a transparent substrate 412, a transparent conductive layer 416, and a transparent photoresist layer 414 disposed between the transparent substrate 412 and the conductive layer 416. The transparent conductive layer 416 of the testing tool 410 is configured to touch the micro-devices 200. To be specific, the testing tool 410 may touch the top surfaces of the micro-devices 200. The configuration of the transparent photoresist layer 414 is optional and may be omitted in some embodiments. Through the configuration, the top surfaces of the micro-devices 200 are provided with a first potential. Meanwhile, the conductive layer 220 is provided with a second potential different from the first potential. Through the conductive layer 416 of the testing tool 410 and the conductive layer 220, a potential difference may be formed, and the potential difference between the first potential and the second potential drives the micro-devices 200.

The photo sensor 420, e. g. a high resolution digital camera, may sense the lighting performance of the micro-devices 200. If the micro-devices 200 exhibit no luminance or irregular luminance, the micro-devices 200 may be defective and designated as the first failed micro-devices 200A (indicated with a cross-dot pattern). Furthermore, in some embodiments, an analyzer may be further adopted to analyze an I-V (current-voltage) curve or a leakage current of the micro-devices 200. If the micro-devices 200 exhibit an irregular I-V curve or an abnormal leakage current, the micro-devices 200 may be defective and designated as the first failed micro-devices 200A.

In some embodiments, for allowing the light emitted from the micro-devices 200 to be transmitted to the photo sensor 420 through the testing tool 410, the conductive layer 416 of the testing tool 410 may be made of a transparent conductive material, such as indium tin oxide. The conductive layer 416 may or may not be patterned. Alternatively, the conductive layer 416 of the testing tool 410 may be nano-silver wires with a width in a range from about 10 nanometers to about 20 nanometers, such that most of the light emitted from the micro-devices 200 is not shielded by the nano-silver wires. Also, the transparent substrate 412 may be made of glass or acrylic that does not block light transmission.

In some embodiments, most of the micro-devices 200 are activated simultaneously, but it should not limit the various embodiments of the present disclosure. In some other embodiments, the testing tool 410 may touch one of the micro-devices 200 each time. For example, the testing tool 410 may include at least one probe to touch at least one of the micro-devices 200 each time, and the micro-devices 200 are tested sequentially.

The methods for testing the micro-devices 200 are illustrated herein, and there may be other adequate methods for testing the micro-devices 200. In still some other embodiments, the first failed micro-device 200A may be determined by testing the photo-luminescence (PL) of the micro-devices 200, instead of by activating the micro-devices 200. Herein, the micro-devices 200 may be irradiated and scanned by a UV light (for example, UV lasers), such that the micro-devices 200 absorb the ultraviolet light and re-emit fluorescent light. The photo sensor 420 equipped with color filters may detect the fluorescent light. For example, for a red micro-LED, the photo sensor 420 is equipped with a red color filter for detecting the fluorescent light. If the micro-devices 200 exhibit no photo-luminescence or irregular photo-luminescence, the micro-devices 200 may be defective and designated as the first failed micro-devices 200A.

Referring to FIG. 1 and FIG. 2C, after the testing, the conductive layer 220 (shown in FIG. 2B) may be patterned to form plural conductive pads 220a attached to the bottoms of the micro-devices 200 respectively. Hereinafter, the micro-devices 200 each includes one of the conductive pads 220a. In some other embodiments, the conductive layer 220 may be patterned before the testing in which the micro-devices 200 are not activated, such as the PL testing.

Referring to FIG. 1 and FIG. 2D, the method 100 proceeds to step 106 by removing the first failed micro-devices 200A from the carrier substrate 310. In some embodiments, the removing of the step 106 may include debonding and removing the first failed micro-devices 200A from the carrier substrate 310 while leaving the other micro-devices 200 bonded on the carrier substrate 310.

Herein, portions 322 of the temporary bonding layer 320 below the first failed micro-devices 200A are locally released, such as being locally heated or exposed to UV light, and portions 324 of the temporary bonding layer 320 below the normal micro-devices 200 are not being released. The released portions 322 are indicated with a dense dotted pattern, while the portions 324 are indicated with a sparse dotted pattern. Therefore, the first failed micro-devices 200A are initially debonded from the carrier substrate 310, and the normal micro-devices 200 are still bonded to the carrier substrate 310.

After the temporary bonding layer 320 is locally released, a transfer head 500 exerts a uniform attracting force on all of the micro devices 200 including the first failed micro-devices 200A. The released portions 322 of the temporary bonding layer 320 provide little adhesion force against the first failed micro-devices 200A. The attracting force of the transfer head 500 is greater than the adhesion force between the released portions 322 and the first failed micro-devices 200A, such that the first failed micro-devices 200A are picked by the transfer head 500, and at least one void V1 is left in the array of the micro-devices 200. In addition, the adhesion force between the portions 324 of the temporary bonding layer 320 and the normal micro devices 200 is maintained and is greater than the attracting force between the normal micro devices 200 and the transfer head 500. Therefore, the normal micro devices 200 stay on the carrier substrate 310 while the first failed micro-devices 200A are picked up.

The transfer head 500 includes at least one electrostatic chuck, using such as but not limited to the attraction of opposite charges to pick up the first failed micro-devices 200A. The transfer head 500 includes a body 510, plural picking units 520, and a connection circuit (not shown). The body 510 has a working surface 512 where the picking units 520 are arranged. In some embodiments, the connection circuit may includes a plurality of conductive lines, which are thin and not shown in FIG. 2D. The conductive lines are disposed on the working surface 512 and connected to all the picking units 520 for simultaneously activating the picking units 520. The connection circuit (such as the conductive lines) has a height lower than the height of the picking units 520, and therefore does not physically obstruct the picking units 520 from approaching the first failed micro-devices 200A.

In some other embodiments, instead of electrostatic chucking, the transfer head 500 may use adhesive chucking or a combination of the adhesive chucking and the electrostatic chucking. An adhesion force between the transfer head 500 and the micro-devices 200 is provided by, for example, adhesive protrusions, and the adhesion force between the transfer head 500 and the micro-devices 200 is designed to be greater than the adhesion force between the released portions 322 of the temporary bonding layer 320 and the failed micro-devices 200A, so that the transfer head 500 can pick up the failed micro-devices 200A by the adhesion force between the transfer head 500 and the micro-devices 200. In still some other embodiments, the picking units 520 can operate with principles of vacuum grippers or mechanical grippers, or the picking units 520 can be any element applicable to pick up the first failed micro-devices 200A.

In the present embodiments, the transfer head 500 exerts a uniform attracting force on all of the micro devices 200, and the first failed micro-devices 200A are debonded and removed from the carrier substrate 310 by the transfer head 500 at one time. In some other embodiments, the micro-devices 200 may be grouped, the transfer head 500 exerts uniform attracting forces on the groups of the micro devices 200 sequentially, and the first failed micro-devices 200A in the groups may be debonded and removed from the carrier substrate 310 by the transfer head 500 sequentially. For example, one of the first failed micro-devices 200A may be debonded and removed from the carrier substrate 310 by transfer head 500 initially, and then the another of the first failed micro-devices 200A may be debonded and removed from the carrier substrate 310 by transfer head 500.

The utilization of the transfer head 500 and the locally released temporary bonding layer 320 should not limit the addressable removal of the first failed micro-devices 200A. Referring to FIG. 2E, instead of the operation shown in FIG. 2D, the removing of the step 106 may include debonding the micro-devices 200 from the carrier substrate 310 and addressably removing the first failed micro-devices 200A from the carrier substrate 310. Herein, as being indicated with a dense dotted pattern, the entire temporary bonding layer 320 is substantially released, such as being uniformly heated or UV exposed, and an addressable transfer head 600 is utilized for addressably picking the first failed micro-devices 200A.

The addressable transfer head 600 includes a body 610, plural picking units 620, and an addressable peripheral driving circuit 630. The body 610 has a working surface 612 having a picking region 612a and at least one circuit region 612b disposed at at least one side of the picking region 612a. The picking units 620 are arranged in the picking region 612a. The addressable peripheral driving circuit 630 is disposed at least in the circuit region 612b.

In some embodiments, the addressable transfer head 600 may use electrostatic chucking. As the picking units 520 of the non-addressable transfer head 500 (shown in FIG. 2D), the picking units 620 may be electrostatic grippers, using such as but not limited to the attraction of opposite charges to pick up the first failed micro devices 200A. In some other embodiments, the picking units 620 can operate with principles of vacuum grippers, adhesive grippers, or mechanical grippers, or the picking units 620 can be any element applicable to pick up the first failed micro devices 200A.

The addressable peripheral driving circuit 630 may include at least one integrated circuit disposed in the circuit region 612b and conductive lines (not shown) disposed in both the circuit region 612b and the picking region 612a for electrically connecting the integrated circuit and the picking units 620. Though the configuration, the addressable peripheral driving circuit 630 is capable of addressably activating the picking units 620.

As shown in FIG. 2E, in some embodiments, the picking region 612a is configured to be larger than or equal to a supporting surface 312 of the carrier substrate 310, and therefore the picking units 620 is capable of approaching the first failed micro devices 200A.

In the embodiments of FIG. 2D and FIG. 2E, adjacent picking units 520 of the non-addressable transfer head 500 or adjacent picking units 620 of the addressable transfer head 600 have a pitch PU1 therebetween. Though the pitch PU1 is substantially the same as the pitch P1, it should not limit various embodiments of the present disclosure. In some other embodiments, the pitch PU1 may be an integral multiple of the pitch P1, such as N×P1, in which N is an integer. In furtherance of the embodiments, a portion of the first failed micro-devices 200A may be removed by the transfer head 500 or the addressable transfer head 600 at the previous step, and another portion of the first failed micro-devices 200A may be removed by said transfer head 500 or said addressable transfer head 600 at the later step. In some embodiments, the first failed micro-devices 200A may be grouped into N groups, and the step of removing the first failed micro-devices 200A may be repeated N times.

Referring to FIG. 2F, after the removing, an intermediate structure S1 for transfer is provided. The intermediate structure S1 includes a carrier substrate 310, plural tested micro-devices 200, and at least one temporary bonding layer 320. The tested micro-devices 200 are present on the carrier substrate 310, in which the tested micro-devices 200 pass at least one test, and there is no failed micro-device which does not pass the test on the carrier substrate 310. In some embodiments, the tested micro-devices 200 are arranged in an array, while at least one void V1 is present in the array. The temporary bonding layer 320 may bond the tested micro-devices 200 onto the carrier substrate 310. Alternatively, in some embodiments, the temporary bonding layer 320 may be entirely released.

Referring to FIG. 1 and FIGS. 2G-2J, the method 100 proceeds to step 108 by transferring the remaining micro-devices 200 from the carrier substrate 310 to a receiving substrate 700 after the removing. The transferring is performed by at least one non-addressable transfer head 800 capable of non-addressably picking the remaining micro-devices 200. In some embodiments, a debanding process may be performed for locally releasing the temporary bonding layer 320, such that the non-addressable transfer head 800 is capable of picking the remaining micro-devices 200.

The non-addressable transfer head 800 may use electrostatic chucking, adhesive chucking, or any combination thereof. In some embodiments, the non-addressable transfer head 800 may have a similar structure as the transfer head 500 (shown in FIG. 2D). As the configuration of the transfer head 500 (shown in FIG. 2D), the non-addressable transfer head 800 includes a body 810, plural picking units 820, and a connection circuit (not shown) electrically connected to all the picking units 820 for simultaneously activating the picking units 820.

Figure 3:
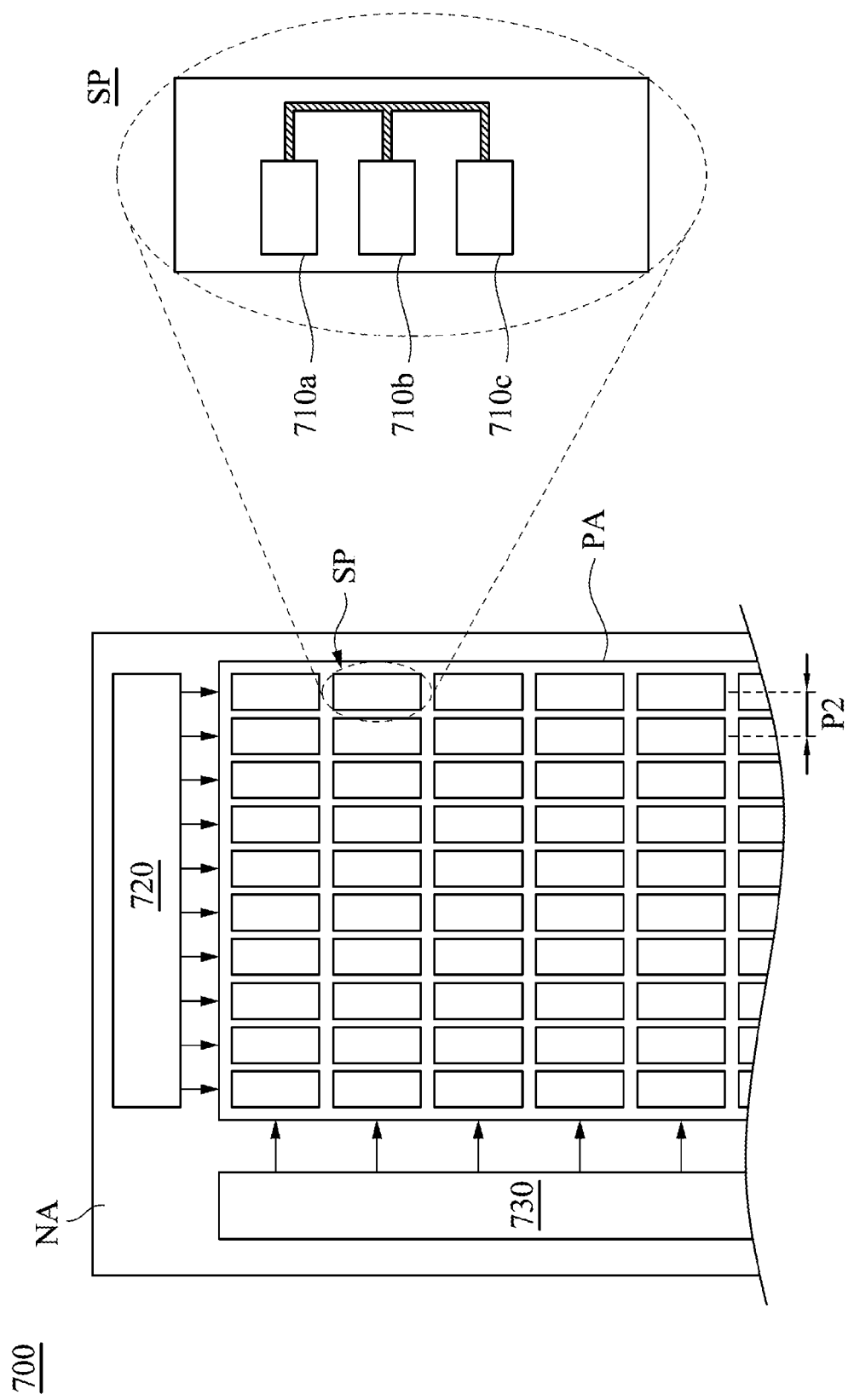
FIG. 3 is a top view of the receiving substrate according to some embodiments of the present disclosure.

In some embodiments, the receiving substrate 700 has an array of pixels corresponding to the array of micro-devices 200. Reference is made to FIG. 2G, FIG. 2H, and FIG. 3.

FIG. 3 is a top view of the receiving substrate 700 according to some embodiments of the present disclosure. In some embodiments, the receiving substrate 700 may support a pixel area PA and at least one non-pixel area NA disposed at at least one side of the pixel area PA. The pixel area PA includes an array of sub-pixels SP arranged in a matrix. Adjacent sub-pixels SP have a pitch P2 therebetween. The non-pixel area NA includes at least one data line driving circuit 720 and at least one scan line driving circuit 730 thereon. The data line driving circuit 720 and the scan line driving circuit 730 are electrically connected to every sub-pixel SP.

As shown in FIG. 3, in some embodiments, each of the sub-pixels SP includes plural electrodes 710a, 710b, and 710c, which are connected. When the array of the micro-devices 200 is deposed onto the receiving substrate 700, the micro-devices 200 are located on the sub-pixels SP respectively, and each micro-device 200 is connected to one of the electrodes 710a, 710b, and 710c of each sub-pixel SP.

Reference is made back to FIGS. 2G-2J. As shown in FIG. 2G, the micro-devices 200 are divided into a plurality of groups, for example, the group A1, the group A2, and the group A3. The groups A1-A3 of the micro-devices 200 have substantially the same pitch, which is substantially the same as the pitch PU2 of the picking units 820 of the non-addressable transfer head 800. Therefore, in the transferring, the non-addressable transfer head 800 may sequentially transfer some of the groups A1-A3 to the receiving substrate 700 (shown in FIG. 2H).

To be specific, as shown in FIG. 2G and FIG. 2H, the group A1 of the micro-devices 200 is gripped by the non-addressable transfer head 800 and released onto the receiving substrate 700. Herein, the temporary bonding layer 320 below the group A1 of the micro-devices 200 are released and indicated as the released portions 326, while the temporary bonding layer 320 below the groups A2 and A3 of the micro-devices 200 are not released and indicated as the unreleased portions 324. Through the configuration, the groups A2 and A3 of the micro-devices 200 are kept to be bonded on the carrier substrate 310 by the portions 324 of the temporary bonding layer 320, while the group A1 of the micro-devices 200 is picked up and transferred by the non-addressable transfer head 800.

Figure 2I:
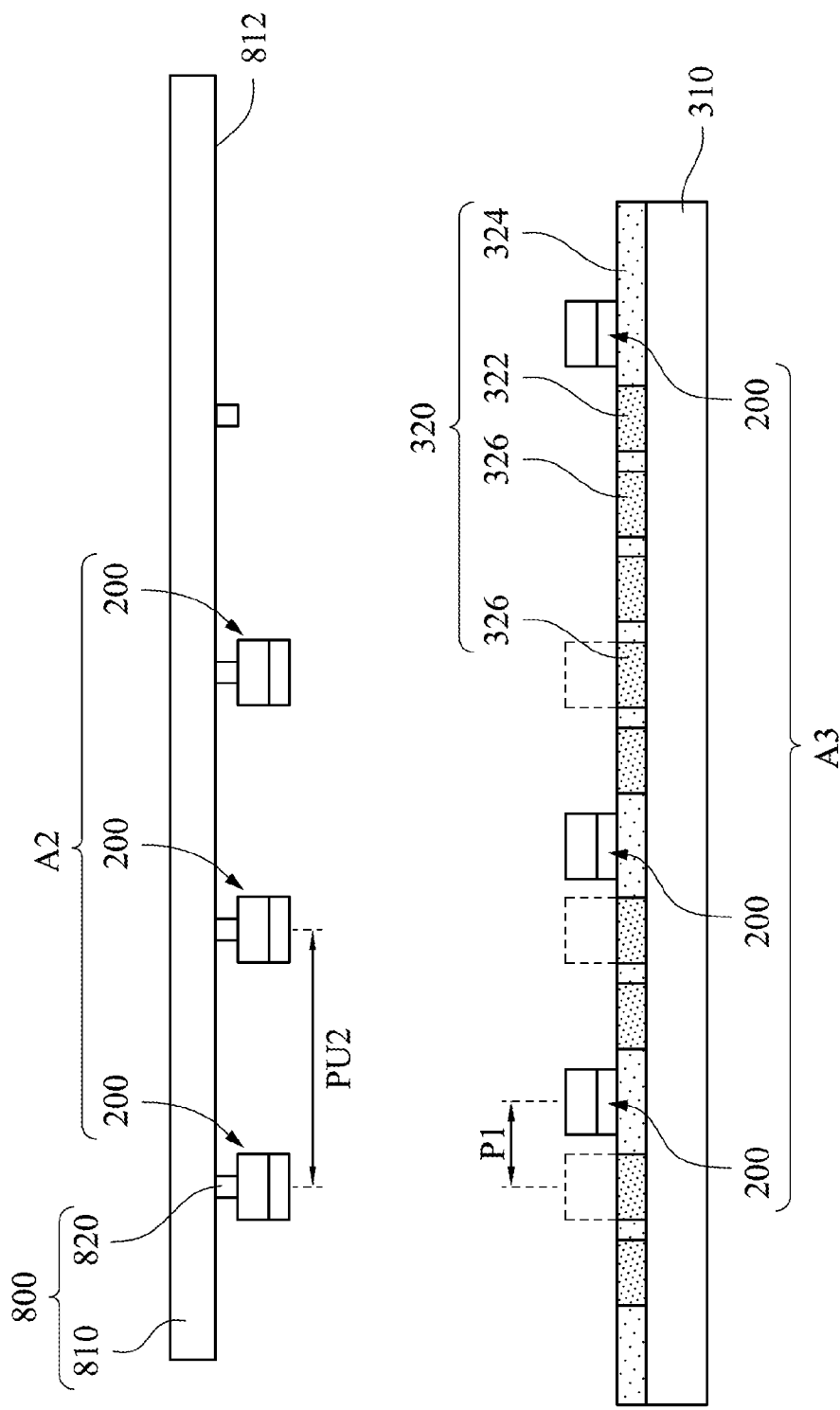
Figure 2J:
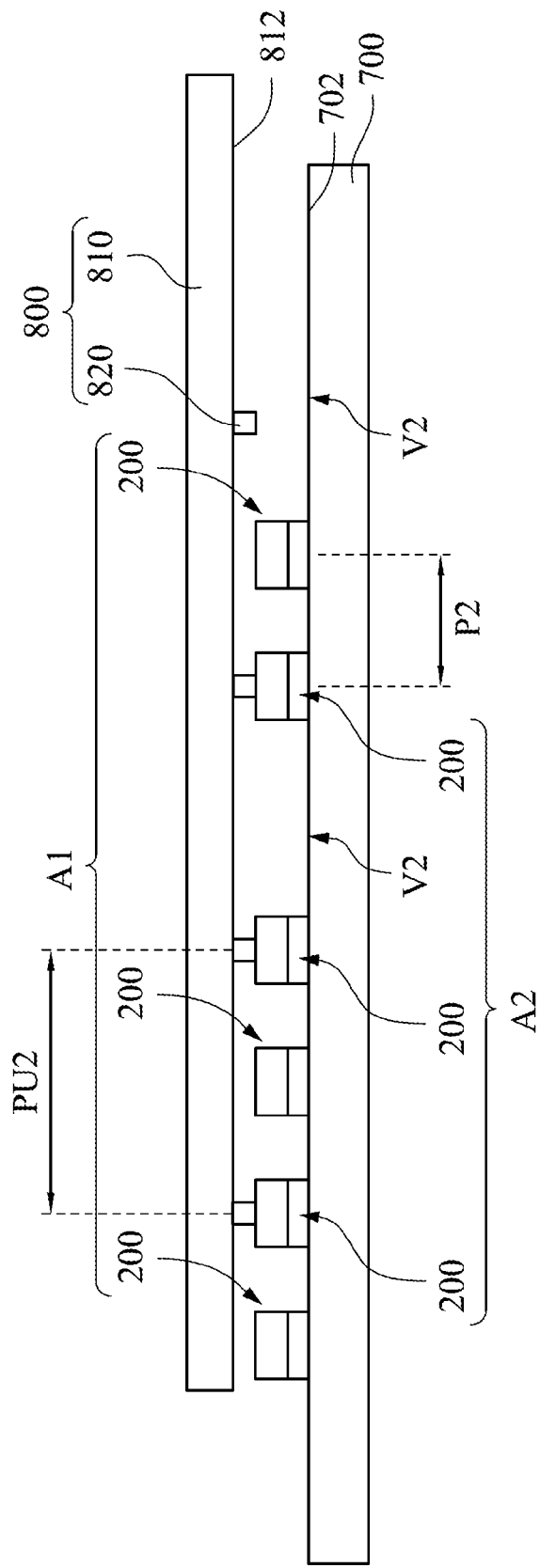

As shown in FIG. 2I and FIG. 2J, the group A2 of the micro-devices 200 is gripped by the non-addressable transfer head 800 and released onto the receiving substrate 700, while the group A1 of the micro-devices 200 is previously disposed on the receiving substrate 700. Herein, the temporary bonding layer 320 below the group A2 of the micro-devices 200 is released and indicated as the released portions 326. Through these steps, the group A2 of the micro-devices 200 is transferred onto the receiving substrate 700. In some embodiments of the present embodiments, since the first failed micro-devices 200A are removed, there may be at least one void V2 in the array of the micro-devices 200 on the receiving substrate 700.

Though the groups A1 and A2 of the micro-devices 200 are alternatively arranged, it should not limit various embodiments of the present disclosure. In some other embodiments, the groups A1 and A2 of the micro-devices 200 may have a different arrangement on the receiving substrate 700.

As shown in FIG. 2G, adjacent picking units 820 of the non-addressable transfer head 800 include the pitch PU2 therebetween, and the pitch PU2 is an integral multiple of the pitch P1. Through the configuration, the non-addressable transfer head 800 is capable of picking the groups A1 and A2 of the micro-devices 200 on the carrier substrate 310 at different stages. On the other hand, as shown in FIG. 2J, adjacent micro-devices 200 on the receiving substrate 700 has the pitch P2 therebetween, which is the same as the pitch P2 of the sup-pixels SP (shown in FIG. 3), and the pitch PU2 is an integral multiple of the pitch P2. In other words, referring to FIGS. 2G and 2J, the pitch PU2 is configured to be a common multiple of the pitch P1 and the pitch P2.

In some embodiments, the micro-devices 200 are of different types, such as red-light micro LEDs, green-light micro LEDs, and blue-light micro LEDs. The micro-devices 200 on different carrier substrates may have the same pitch P1. When the micro-devices 200 of different types are transferred from different carrier substrates but to the same-receiving substrate 700, the pitch PU2 of the picking units 820 is configured to be a common multiple of the pitch P1, the pitch P2, and the number of the types of the micro-devices 200.

Referring to FIG. 2H, in some embodiments, the body 810 of the non-addressable transfer head 800 has a working surface 812 where the picking units 820 are arranged. Herein, the working surface 812 is smaller than the supporting surface 702 of the receiving substrate 700. The working surface 812 may be larger than or equal to the pixel area PA of the receiving substrate 700 (shown in FIG. 3). In some other embodiments, the working surface 812 may be larger than or equal to the supporting surface 702 of the receiving substrate 700.

Figure 2K:
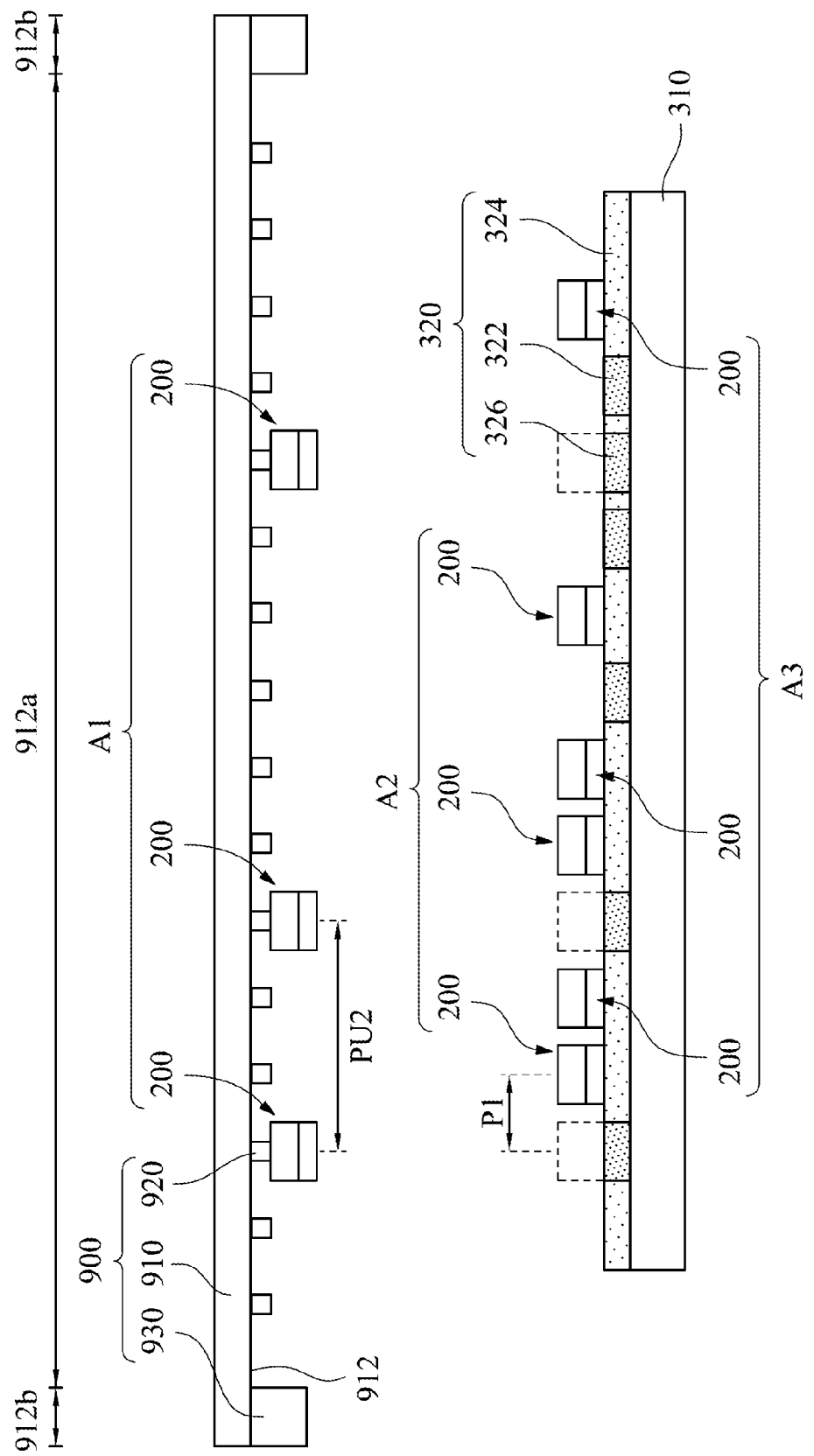

Reference is made to FIG. 2K, in some other embodiments, the transferring is performed by at least one transfer head 900 capable of addressably picking at least one of the remaining micro-devices 200, instead of the non-addressable transfer head 800 shown in FIGS. 2G-2J. Reference is made to FIG. 2F and FIG. 2K, the transferring may include addressably transferring at least one group of the remaining micro-devices 200 from the carrier substrate 310 to the receiving substrate 700 and addressablely transferring at least another group of the remaining micro-devices 200 from the carrier substrate 310 to the receiving substrate 700. FIG. 2K shows the initial step of the transferring, in which the group A1 of the micro-devices 200 is gripped from the carrier substrate 300 and the groups A2 and A3 of the micro-devices 200 are left on the carrier substrate 310.

In some embodiments, since the transfer head 900 is capable of addressably picking the remaining micro-devices 200, the entire temporary bonding layer 320 of the intermediate structure S1 (shown in FIG. 2F) may be substantially released by, for example, uniformly heating or UV exposure.

In some embodiments, the transfer head 900 may have a similar structure as the addressable transfer head 600 (shown in FIG. 2E). The addressable transfer head 900 includes a body 910, plural picking units 920, and an addressable peripheral driving circuit 930. The body 910 has a working surface 912 having a picking region 912a and at least one circuit region 912b disposed at at least one side of the picking region 912a. The picking units 920 are arranged in the picking region 912a. The addressable peripheral driving circuit 930 is disposed at least in the circuit region 912b. Herein, the work surface 912 of the body 910 may be greater than the supporting surface 702 of the receiving substrate 700 (shown in FIG. 2H and FIG. 2J). To be specific, the picking region 912a is greater than the supporting surface 702 of the receiving substrate 700 (shown in FIG. 2H and FIG. 2J), such that the transfer head 900 may approach the receiving substrate 700 (shown in FIG. 2H and FIG. 2J). The detail structure of the transfer head 900 is similar to the configuration of the addressable transfer head 600 (shown in FIG. 2E), and therefore not repeated herein.

Reference is made back to FIG. 2J. In some embodiments, after the transferring, there may be at least one malfunctioning portion in the array of the micro-devices 200 on the receiving substrate 700, in which the malfunctioning portion may result from the voids V2 or some of the micro-devices 200 which are not successfully bonded to the electrodes of the receiving substrate 700.

Figure 2L:
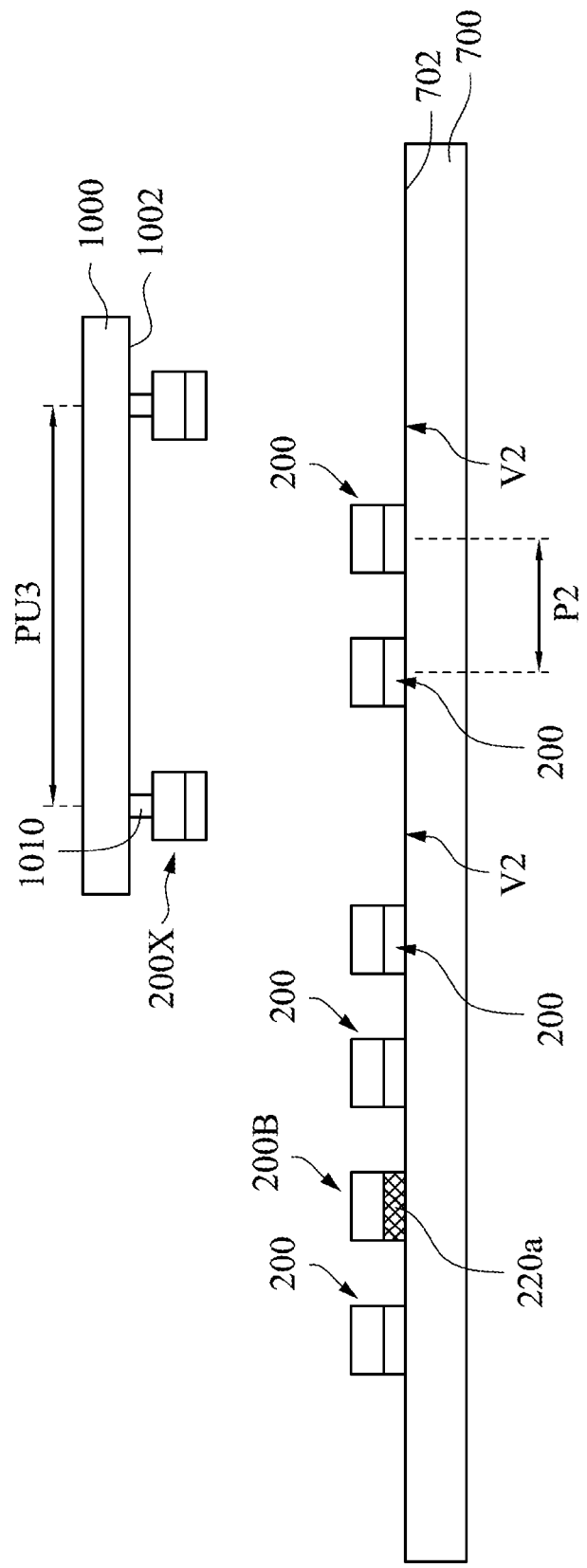
Figure 2M:
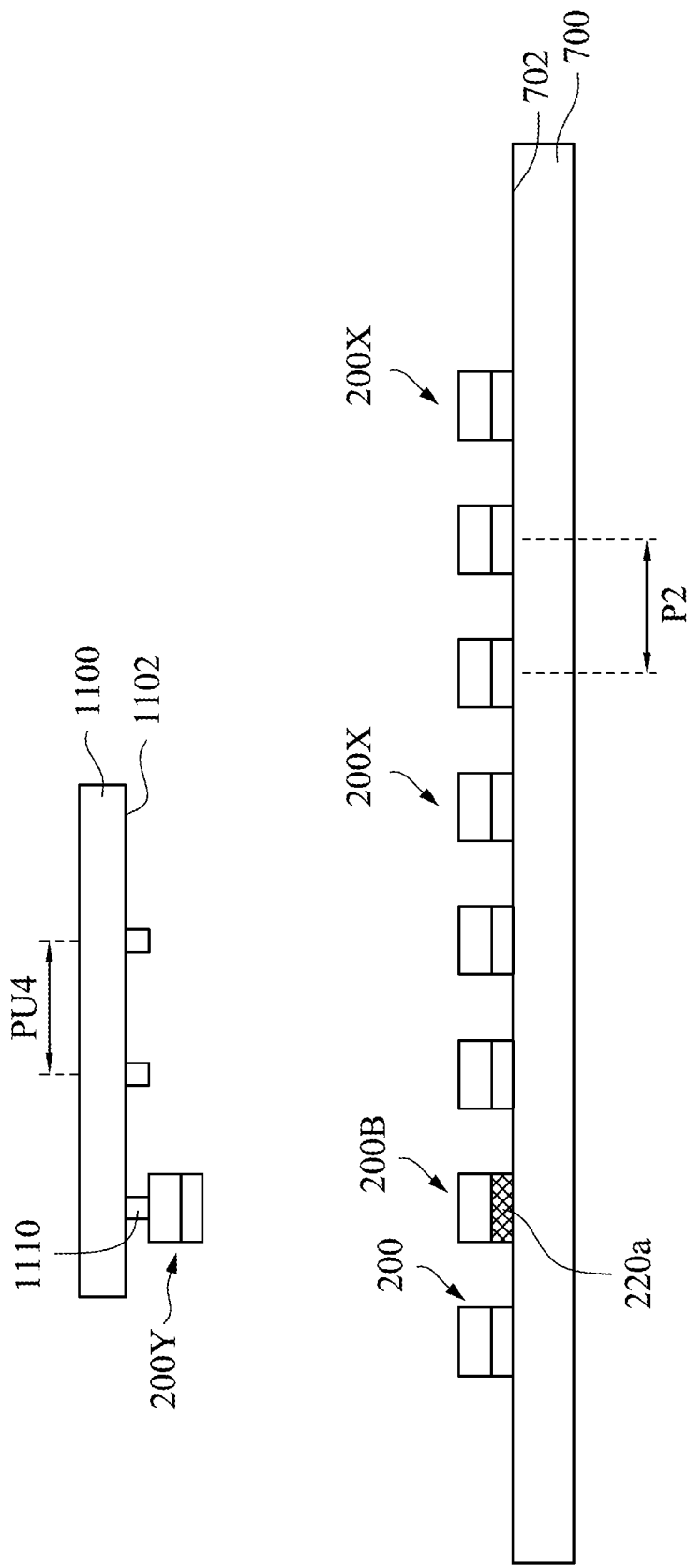
Figure 2N:
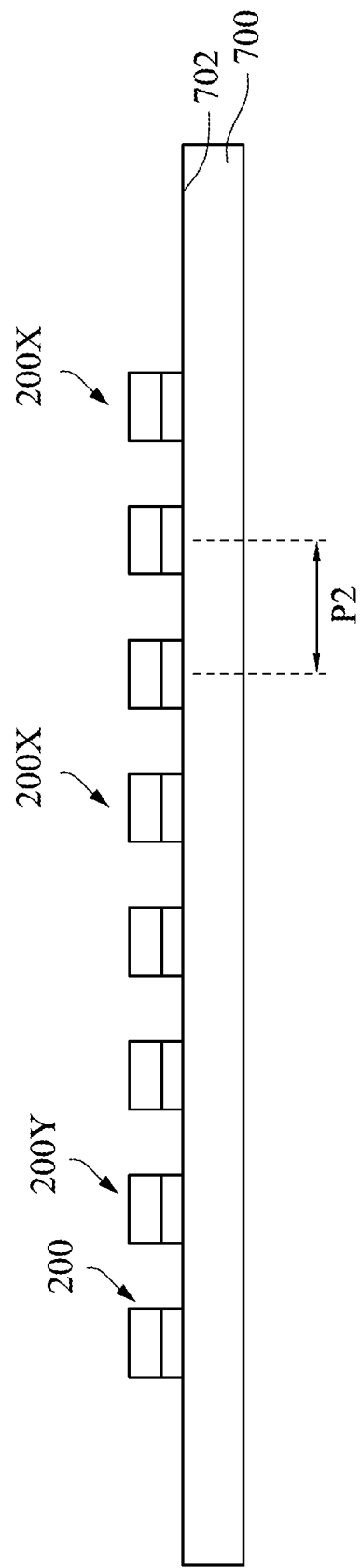

Referring to FIG. 1 and FIGS. 2L-2M, the method 100 proceeds to step 110 by mending at least one malfunctioning portion in the array of the micro-devices 200. The location of the voids V2 on the receiving substrate 700 may be inferred from the positions of the first failed micro-devices 200A (shown in FIG. 2C). In some embodiments, during or after the transferring, the micro-devices 200 on the receiving substrate 700 are tested to determine if there is at least one second failed micro-device 200B on the receiving substrate 700, and the location of the second failed micro-device 200B is obtained thereto. The second failed micro-device 200B is the micro-device 200 that fails to be properly bonded to one of the electrodes 710a, 710b, and 710c (shown in FIG. 3). To be specific, the contact pad 220a of the second failed micro-device 200B is not successfully electrically connected to one of the electrodes 710a, 710b, and 710c (shown in FIG. 3) of the receiving substrate 700 and is indicated with a cross-hatch pattern.

Herein, the mending for the void V2 and the second failed micro-device 200B may be performed respectively in FIG. 2L and FIG. 2M. To be specific, the mending includes at least one of patching the voids V2 in the array of micro-devices 200 with at least one patching micro-devices 200X when the malfunctioning portion includes the voids V2 and repairing at least one second failed micro-device 200B in the array of the micro-devices 200 with at least one repairing micro-devices 200Y when the malfunctioning portion includes the second failed micro-device 200B. In some embodiments, a plurality of malfunctioning portions are mended by plural steps, and the mending includes mending at least one of the malfunctioning portions initially and mending at least another of the malfunctioning portions subsequently. The mending for the voids V2 and the second failed micro-device 200B may be performed by electrostatic chucking, adhesive chucking, or any combination thereof.

Referring to FIG. 2L, the voids V2 on the receiving substrate 700 are patched with at least one patching micro-device 200X. Herein, a transfer head 1000 having a similar structure as the non-addressable transfer head 800 (shown in FIG. 2G) may be adopted for the patching, but the work surface 1002 of the transfer head 1000 may be smaller than that of the non-addressable transfer head 800 (shown in FIG. 2G). To be specific, since the transfer head 1000 is used for patching a certain region in the array of micro devices 200 but not an entire region in the array of micro devices 200, the working surface 1002 of the transfer head 1000 may be smaller than the supporting surface 702 of the receiving substrate 700. Furthermore, the working surface 1002 of the transfer head 1000 may be smaller than the pixel area PA of the receiving substrate 700 (shown in FIG. 3).

In some embodiments, the transfer head 1000 may patch the voids V2 by plural times, in which the transfer head 1000 releases one or more patching micro-devices 200X on the receiving substrate 700 each time.

In some embodiments, the first failed micro-devices 200A may be in a regular pattern, and therefore the voids V2 may be present in the regular pattern. In some embodiments, the patching is performed by at least one transfer head 1000 having a patterned picking surface corresponding to the regular pattern of the voids V2, such that the void V2 may be patched with the transfer head 1000 by non-addressable picking the patching micro-device 200X. For example, the picking units 1010 of the transfer head 1000 has a pitch PU3 therebetween, and the pitch PU3 is substantially the same as the distance between two of the voids V2.

In some embodiments, the patching micro-devices 200X may be micro-devices disposed on another carrier substrate (not shown). Alternatively, in some other embodiments, the micro-devices 200 disposed on the carrier substrate 310 (shown in FIG. 2F) may not be totally transferred to the receiving substrate 700, and the patching micro-devices 200X may be a portion of the micro-devices 200 left on the carrier substrate 310 (shown in FIG. 2I), such as the groups A3 of the micro-devices 200.

In some embodiments, the pitch PU3 of the picking units 1010 is a common multiple of the pitch P2 and the pitch of the patching micro-devices 200X on the corresponding carrier substrate (not shown). In some other embodiments, the micro-devices 200 are of different types, such as red-light micro LEDs, green-light micro LEDs, and blue-light micro LEDs. The pitch PU3 of the picking units 1010 is a common multiple of the pitch P2, the number of the types of the micro-devices 200, and the pitch of the patching micro-devices 200X on the corresponding carrier substrate (not shown).

In some embodiments, before or after the patching, the micro-devices 200 on the receiving substrate 700 are tested to determine if there is at least one second failed micro-device 200B on the receiving substrate 700. Reference is made to both FIG. 2M and FIG. 3. In some embodiments, a testing tool (such as the testing tool 410 in FIG. 2B) and a photo sensor (such as the photo sensor 420 in FIG. 2B) may be utilized. The pixel circuit (including the electrodes 710a, 710b, and 710c, the data line driving circuit 720, and the scan line driving circuit 730) on the receiving substrate 700 and the testing tool drive the micro-devices 200 with a potential difference, such that the photo sensor may determine whether the micro-devices 200 are lighted. As the step 104 illustrated in FIG. 1 and FIG. 2B, if the micro-devices 200 exhibit no luminance, irregular luminance, an irregular I-V curve, or an abnormal leakage current, the micro-devices 200 may be defective and designated as the second failed micro-devices 200B.

Referring to FIG. 2M and FIG. 3, the second failed micro-device 200B on the receiving substrate 700 is repaired with at least one repairing micro-devices 200Y by the transfer head 1100.

Through the plural electrodes 710a, 710b, and 710c of each of the sub-pixels SP, if there is a second failed micro-device 200B on the electrodes 710a, the second failed micro-device 200B may not be removed from the electrodes 710a. Because there are the electrodes 710b and 710c within the sub-pixel SP (shown in FIG. 3), the repairing micro-device 200Y can be bonded to the electrode 710b or 710c. As a result, the damage caused by removal of the second failed micro-device 200B can be avoided, and the yield rate of manufacturing the light-emitting diode display device is improved.

Herein, a transfer head 1100 have a similar structure as the non-addressable transfer head 800 (shown in FIG. 2G) may be adopted for the repairing. To be specific, the working surface 1102 of the transfer head 1100 may be smaller than the pixel area PA of the receiving substrate 700 (shown in FIG. 3).

Though it is not shown in FIG. 2M, in some embodiments, there may be a plurality of second failed micro-devices 200B in a regular pattern. Therefore, the repairing may be performed by the transfer head 1100 having a patterned picking surface corresponding to the second failed micro-device 200B, such that the second failed micro-device 200B may be repaired with the transfer head 1100 by non-addressable picking the repairing micro-device 200Y. To be specific, in some embodiments, the picking units 1110 of the transfer head 1100 may have a pitch PU4 therebetween, and the pitch PU4 of the picking units 1110 may be substantially the same as the distance between two of the second failed micro-device 200B, such that the picking units 1110 may release the repairing micro-devices 200Y to the sub-pixels SP (shown in FIG. 3) where the second failed micro-device 200B are disposed.

In some embodiments, the transfer head 1100 may repair a plurality of second failed micro-devices 200B by plural times, in which the transfer head 1100 releases one or more repairing micro-devices 200Y on the receiving substrate 700 each time.

In some embodiments, the repairing micro-devices 200Y may be micro-devices disposed on another carrier substrate (not shown). Alternatively, in some other embodiments, the repairing micro-devices 200Y may be a portion of the micro-devices 200 disposed on the carrier substrate 310 (shown in FIG. 2I), such as the groups A3 of the micro-devices 200.

In some embodiments, the pitch PU4 of the picking units 1110 is a common multiple of the pitch P2 and the pitch of the repairing micro-devices 200Y on the corresponding carrier substrate (not shown). In some other embodiments, the micro-devices 200 are of different types, such as red-light micro LEDs, green-light micro LEDs, and blue-light micro LEDs. The pitch PU4 of the picking units 1110 is a common multiple of the pitch P2, the number of types of the micro-devices 200, and the pitch of the repairing micro-devices 200Y on the corresponding carrier substrate (not shown).

The transfer head 1000 in FIG. 2L and the transfer head 1100 in FIG. 2M are illustrated as non-addressable transfer heads which may use electrostatic chucking, adhesive chucking, or any combination thereof. The non-addressable transfer heads may have the patterned picking surface corresponding to the regular pattern of the malfunctioning portions. However, in some embodiments, the transfer head 1000 and the transfer head 1100 may be addressable transfer heads while the addressable driving circuits may be formed on the backside of the body, such that the addressable driving circuits does not obstruct the picking units 1010 or the picking units 1110 from approaching the micro devices 200 on the receiving substrate 700.

After the repairing, the micro-devices on the receiving substrate 700 are tested to determine if each of the sub-pixels SP (shown in FIG. 3) has at least one normal micro-device thereon. After the testing, a data acquisition module (not illustrated) can collect the test result and the position information of the failed micro-devices of each of the sub-pixels SP (shown in FIG. 3). Thereafter, if most or all of the sub-pixels SP (i. g. more than 99.8% of the sub-pixels SP) are tested to have normal micro-devices, the test is passed. On the other hand, if at least a predetermined percentage of the sub-pixels SP (e.g. at least 0.2% of the sub-pixels SP) are tested to have no normal micro-devices, the repairing process is repeated. It should be understood that, the defect rate of performing the step 110 could be set to meet the production control.

Referring to FIG. 2N, an apparatus having an array of micro devices with few or no malfunctioning portion is obtained. To be specific, the apparatus has the patching micro devices 200X, the repairing micro device 200Y, and the micro devices 200 which have fine semiconductor layers (which indicate the micro devices 200 at least pass the test shown in FIG. 2B). In some embodiments, the patching micro devices 200X, the repairing micro device 200Y, and the micro devices 200 may have substantially the same structure.

In some embodiments of the present disclosure, the micro-devices on a carrier substrate are tested, and the defective micro-devices are removed from the carrier substrate. When the micro-devices are respectively transferred to pixels of a receiving substrate, the defective micro-devices are neither transferred to the receiving substrate nor occupying spaces of corresponding pixels of the receiving substrate. Voids on the receiving substrate are patched with patching micro-devices, and the failed micro-devices, which are unsuccessfully attached to the receiving substrate, are repaired with repairing micro-devices.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for preparing a plurality of micro-devices for transfer, the method comprising:
   temporarily bonding the micro-devices onto a carrier substrate;
   testing the micro-devices on the carrier substrate to determine if there is at least one first failed micro-device in the micro-devices;
   removing the first failed micro-device from the carrier substrate;
   transferring remaining micro-devices from the carrier substrate to a receiving substrate after the removing;
   acquiring at least one location of at least one micro-device void on the receiving substrate; and
   patching the micro-device void on the receiving substrate with at least one patching micro-device.

2. The method of claim 1, wherein the removing comprises:
   reducing a bonding force of a bonding layer used to bond the micro-devices; and
   addressably removing the first failed micro-device from the carrier substrate.

3. The method of claim 1, wherein the removing comprises:
   reducing a bonding force of a bonding layer used to bond the first failed micro-device while leaving the other micro-device bonded on the carrier substrate; and
   removing the first failed micro-device.

4. The method of claim 1, wherein the transferring is performed by at least one transfer head capable of addressably picking at least one of the remaining micro-devices.

5. The method of claim 1, wherein the transferring is performed by at least one transfer head capable of non-addressably picking the remaining micro-devices.

6. The method of claim 1, wherein the transferring is performed by electrostatic chucking, adhesive chucking, or any combination thereof.

7. The method of claim 1, wherein the transferring comprises:
- addressably transferring at least one of the remaining micro-devices from the carrier substrate to the receiving substrate; and
- addressably transferring at least another of the remaining micro-devices from the carrier substrate to the receiving substrate.

8. The method of claim 1, further comprising:
- storing at least one location of the first failed micro-device on the carrier substrate; and
- determining the location of the micro-device void on the receiving substrate according to the location of the first failed micro-device on the carrier substrate.

9. The method of claim 1, further comprising:
- testing the micro-devices on the receiving substrate to determine if there is at least one pixel having a second failed micro-device on the receiving substrate; and
- disposing at least one repairing micro-device onto the pixel having the second failed micro-device on the receiving substrate.

* * * * *